US011296249B2

(12) United States Patent
Zhou et al.

(10) Patent No.: US 11,296,249 B2
(45) Date of Patent: Apr. 5, 2022

(54) PHOTOSENSITIVE DEVICE AND MANUFACTURING METHOD THEREOF, DETECTION SUBSTRATE AND ARRAY SUBSTRATE

(71) Applicant: BOE Technology Group Co., Ltd., Beijing (CN)

(72) Inventors: Tianmin Zhou, Beijing (CN); Rui Huang, Beijing (CN); Lizhong Wang, Beijing (CN); Jipeng Song, Beijing (CN); Tao Yang, Beijing (CN); Zhaohui Qiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 16/812,764

(22) Filed: Mar. 9, 2020

(65) Prior Publication Data

US 2021/0050469 A1    Feb. 18, 2021

(30) Foreign Application Priority Data

Aug. 14, 2019   (CN) .......................... 201910752416.1

(51) Int. Cl.
*H01L 31/101* (2006.01)
*H01L 31/11* (2006.01)
*H01L 31/0224* (2006.01)
(Continued)

(52) U.S. Cl.
CPC .......... *H01L 31/11* (2013.01); *H01L 31/0224* (2013.01); *H01L 31/02366* (2013.01); *H01L 31/0392* (2013.01)

(58) Field of Classification Search
CPC ................. H01L 31/11; H01L 31/0224; H01L 31/02366; H01L 31/0392; H01L 29/4908;
(Continued)

(56) References Cited

U.S. PATENT DOCUMENTS

2014/0217399 A1    8/2014   Wu et al.
2017/0092673 A1*   3/2017   Miyamoto ........ H01L 27/14609
(Continued)

FOREIGN PATENT DOCUMENTS

CN        1992296 A    7/2007
CN       108279028 A   7/2018
(Continued)

OTHER PUBLICATIONS

First Office Action, including Search Report, for Chinese Patent Application No. 201910752416.1, dated Mar. 18, 2021, 30 pages.

*Primary Examiner* — Calvin Y Choi
(74) *Attorney, Agent, or Firm* — Westman, Champlin & Koehler, P.A.

(57) ABSTRACT

A photosensitive device, a manufacturing method thereof, a detection substrate and an array substrate are provided. The photosensitive device is formed on a substrate, and it includes a photosensitive element and a thin film transistor. The photosensitive element includes a first electrode layer on the substrate; a second electrode layer on a side of the first electrode layer distal to the substrate; and a photoelectric conversion layer between the first electrode layer and the second electrode layer. The thin film transistor is electrically connected to the photosensitive element, and it includes a first gate electrode on the substrate; an active layer on a side of the first gate electrode distal to the substrate; and a second gate electrode on a side of the active layer distal to the substrate. The first electrode layer and the second gate electrode are located in the same layer.

17 Claims, 15 Drawing Sheets

(51) Int. Cl.
*H01L 31/0236* (2006.01)
*H01L 31/0392* (2006.01)

(58) Field of Classification Search
CPC .......... H01L 29/42384–42392; H01L
29/78645–78648; H01L 29/8126; H01L
29/78669; H01L 29/78678; H01L
29/66765; H01L 29/78615; H01L
27/3248; H01L 27/124; H01L
27/14–14893; H01L 27/14678; H01L
29/78666; H01L 29/78675; H01L
29/66757; H01L 29/78648; H01L
29/66742–6678; H01L 29/786–78696;
H01L 27/12–13; H01L 2924/13069;
H01L 51/0508–057; H01L 29/04–045;
H01L 29/16–1608; H01L 29/18–185;
H01L 29/22–2206; H01L 29/36–365;
H01L 27/146–14893; H01L 51/50–56;
H01L 51/0032–0095; H01L 27/32–3297;
H01L 2251/50–568; B32B 2457/206

USPC ........................................................ 257/462
See application file for complete search history.

(56) References Cited

U.S. PATENT DOCUMENTS

| | | |
|---|---|---|
| 2017/0289805 A1 | 10/2017 | Hong |
| 2019/0095672 A1* | 3/2019 | Yeke Yazdandoost ..................... H01L 27/1462 |
| 2020/0105789 A1 | 4/2020 | Fang et al. |
| 2020/0219917 A1 | 7/2020 | Xie et al. |

FOREIGN PATENT DOCUMENTS

| | | |
|---|---|---|
| CN | 108550595 A | 9/2018 |
| CN | 109300917 A | 2/2019 |
| JP | 2009288956 A | 12/2009 |

* cited by examiner

PHOTOSENSITIVE DEVICE AND MANUFACTURING METHOD THEREOF, DETECTION SUBSTRATE AND ARRAY SUBSTRATE

CROSS-REFERENCE TO RELATED APPLICATION

This application claims the benefit of Chinese Patent Application No. 201910752416.1 filed on Aug. 14, 2019 in the State Intellectual Property Office of China, the whole disclosure of which is incorporated herein by reference.

TECHNICAL FIELD

The present disclosure relates to the field of optoelectronic technologies, and in particular, to a photosensitive device, a detection substrate including the photosensitive device, an array substrate including the photosensitive device, and a method for manufacturing the photosensitive device.

BACKGROUND

In recent years, an optical fingerprint recognition technology and an X-ray detection technology have been widely used. A photosensitive device is a main component applied in the optical fingerprint recognition technology and the X-ray detection technology. The photosensitive device generally includes a photosensitive element and a thin film transistor (abbreviated as TFT). The photosensitive element may convert visible light into electrical signals, and the thin film transistor may receive the electrical signals and output the electrical signals to achieve light detection. Therefore, how to design structures of the photosensitive element and the thin film transistor and optimize their manufacturing processes so as to improve a performance of the photosensitive device has gradually become an important issue that research personnel may pay attention to.

SUMMARY

In an aspect, a photosensitive device is provided. The photosensitive device is formed on a substrate, and the photosensitive device includes a photosensitive element and a thin film transistor electrically connected to the photosensitive element. The photosensitive element includes a first electrode layer on the substrate; a second electrode layer on a side of the first electrode layer distal to the substrate; and a photoelectric conversion layer between the first electrode layer and the second electrode layer. The thin film transistor includes a first gate electrode on the substrate; an active layer on a side of the first gate electrode distal to the substrate; and a second gate electrode on a side of the active layer distal to the substrate. The first electrode layer and the second gate electrode are located in the same layer.

Optionally, the photosensitive device further includes an interlayer insulating layer, wherein the interlayer insulating layer includes a first via hole and a first recess, at least a part of the first electrode layer is filled in the first via hole, and at least a part of the second gate electrode is filled in the first recess.

Optionally, the active layer includes a source region, a drain region and a channel region, and the channel region is located between the source region and the drain region, the interlayer insulating layer includes a first portion and a second portion, and an orthographic projection of the first portion on the substrate at least partially overlaps with an orthographic projection of the channel region on the substrate, and an orthographic projection of the second portion on the substrate at least partially overlaps with an orthographic projection of the source region or the drain region on the substrate, and a thickness of the first portion is smaller than a thickness of the second portion.

Optionally, an orthographic projection of the first recess on the substrate at least partially overlaps with the orthographic projection of the first portion on the substrate.

Optionally, the thickness of the first portion is in a range of 100 to 200 nm.

Optionally, the orthographic projection of the channel region on the substrate falls within an orthographic projection of each of the first gate electrode and the second gate electrode on the substrate.

Optionally, the thin film transistor further includes a source electrode and a drain electrode, the orthographic projection of the source region on the substrate partially overlaps with an orthographic projection of the source electrode on the substrate, and the orthographic projection of the drain region on the substrate partially overlaps with an orthographic projection of the drain electrode on the substrate; and the first electrode layer contacts the source electrode or the drain electrode, and an orthographic projection of the first electrode layer on the substrate falls within the orthographic projection of the source electrode or the drain electrode on the substrate.

Optionally, the photosensitive device further includes an overcoating layer, wherein the overcoating layer covers both the photosensitive element and the thin film transistor, and the overcoating layer includes a second via hole and a third via hole, the second via hole exposes a part of the second electrode layer, and the third via hole exposes a part of the second gate electrode; and the photosensitive device includes a first electrode lead and a second electrode lead, the first electrode lead and the second electrode lead are located in the same layer, a part of the first electrode lead is filled in the second via hole so as to electrically connect with the second electrode layer, and a part of the second electrode lead is filled in the third via hole so as to electrically connect with the second gate electrode.

Optionally, the active layer includes an oxide semiconductor layer.

Optionally, the photoelectric conversion layer includes: a first semiconductor layer located on a side of the first electrode layer distal to the substrate; an intrinsic semiconductor layer on a side of the first semiconductor layer distal to the substrate; and a second semiconductor layer on a side of the intrinsic semiconductor layer distal to the substrate, wherein, the first semiconductor layer is one selected from a P-type amorphous silicon layer or an N-type amorphous silicon layer, the intrinsic semiconductor layer is an intrinsic amorphous silicon layer, and the second semiconductor layer is the other one selected from the P-type amorphous silicon layer or the N-type amorphous silicon layer.

Optionally, the first gate electrode, the second gate electrode, the source electrode, the drain electrode and the first electrode layer each include a metal conductive material, and the second electrode layer includes a transparent conductive material.

In another aspect, a detection substrate is provided, including: a substrate; and at least one photosensitive device on the substrate, wherein the photosensitive device is the photosensitive device as described above.

In a further aspect, an array substrate is provided, including: a substrate; a plurality of sub-pixels on the substrate; a plurality of display components, the plurality of display components being disposed within the plurality of sub-pixels, respectively; and at least one photosensitive device, the at least one photosensitive device being disposed within at least one sub-pixel, wherein the photosensitive device is the photosensitive device as described above.

Optionally, each of the display components includes: an organic light emitting element; and a display driving element, the display driving element being electrically connected to the organic light emitting element and configured to drive the organic light emitting element to emit light, wherein, the display driving element includes a thin film transistor, and the thin film transistor of the display driving element and the thin film transistor of the photosensitive device are identical in structure.

Optionally, an orthographic projection of the organic light emitting element of the display component on the substrate does not overlap with an orthographic projection of the photosensitive element of the photosensitive device on the substrate.

In another further aspect, a method for manufacturing a photosensitive device is provided, including: forming a first gate electrode of a thin film transistor on a substrate; forming an active layer of the thin film transistor on a side of the first gate electrode distal to the substrate; forming a second gate electrode of the thin film transistor and a first electrode layer of a photosensitive element on a side of the active layer distal to the substrate; forming a photoelectric conversion layer of the photosensitive element on a side of the first electrode layer distal to the substrate; and forming a second electrode layer of the photosensitive element on a side of the photoelectric conversion layer distal to the substrate, wherein, the step of forming the second gate electrode of the thin film transistor and the first electrode layer of the photosensitive element includes: forming the second gate electrode of the thin film transistor and the first electrode layer of the photosensitive element by using the same material and through the same patterning process.

Optionally, the method further includes: forming a source-drain electrode layer of the thin film transistor on a side of the active layer distal to the substrate; forming an interlayer insulating material layer on a side of the source-drain electrode layer distal to the substrate; and forming a first recess and a first via hole in the interlayer insulating material layer through a patterning process to form an interlayer insulating layer including the first recess and the first via hole, wherein, the forming the second gate electrode of the thin film transistor and the first electrode layer of the photosensitive element by using the same material and through the same patterning process includes:

depositing a metal material layer on a surface of the interlayer insulating layer distal to the substrate, in the first recess and in the first via hole; and patterning the metal material layer to form the second gate electrode and the first electrode layer through one patterning process, so that at least a part of the second gate electrode is filled in the first recess and at least a part of the first electrode layer is filled in the first via hole.

Optionally, the forming the first recess and the first via hole in the interlayer insulating material layer through the patterning process includes:

coating a surface of the interlayer insulating material layer distal to the substrate with a photoresist layer;

exposing and developing the photoresist layer by using a gray-tone mask, so that a part of the photoresist layer corresponding to the first via hole to be formed is completely removed, and a part of the photoresist layer corresponding to the first recess to be formed is partially removed;

performing a first etching process on the interlayer insulating material layer to completely etch the interlayer insulating material layer at a position of the first via hole to be formed so as to form the first via hole;

performing an ashing process on the remaining photoresist layer to completely expose the interlayer insulating material layer at a position of the first recess to be formed; and performing a second etching process on the interlayer insulating material layer to partially etch the interlayer insulating material layer at the position of the first recess to be formed so as to form the first recess.

Optionally, the forming the first recess and the first via hole in the interlayer insulating material layer through the patterning process includes:

coating a surface of the interlayer insulating material layer distal to the substrate with a photoresist layer;

exposing and developing the photoresist layer by using a gray-tone mask, so that a part of the photoresist layer corresponding to the first via hole to be formed is completely removed, and a part of the photoresist layer corresponding to the first recess to be formed is partially removed;

performing a first etching process on the interlayer insulating material layer to partially etch the interlayer insulating material layer at a position of the first via hole to be formed;

performing an ashing process on the remaining photoresist layer to completely expose the interlayer insulating material layer at a position of the first recess to be formed; and performing a second etching process on the interlayer insulating material layer to completely etch the remaining interlayer insulating material layer at the position of the first via hole to be formed and partially etch the interlayer insulating material layer at the position of the first recess to be formed, so as to form the first via hole and the first recess.

BRIEF DESCRIPTION OF THE DRAWINGS

Other objects and advantages of the present disclosure will become apparent from the following description of the present disclosure with reference to accompanying drawings, and the following description may help a comprehensive understanding of the present disclosure.

Figure 1:
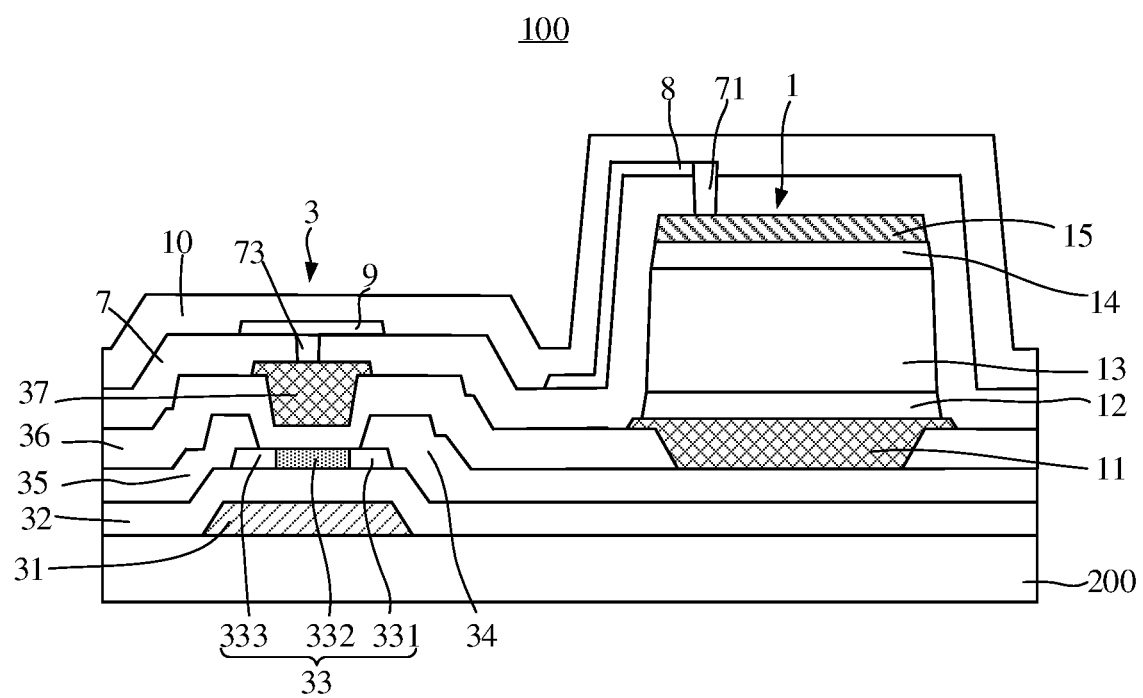
FIG. 1 is a schematic structural view of a photosensitive device according to some embodiments of the present disclosure.

It should be noted that, for the sake of clarity, dimensions of layers, structures or regions may be enlarged or reduced in the drawings for describing the embodiments of the present disclosure, that is, these drawings are not drawn to actual scales.

DETAILED DESCRIPTION OF EMBODIMENTS

The technical solutions of the present disclosure will be further described in detail through embodiments and the accompanying drawings. In the specification, the same or similar reference numerals indicate the same or similar components. The following description of the embodiments of the present disclosure with reference to the drawings is intended to explain the general inventive concept of the present disclosure and should not be construed as a limitation to the present disclosure.

In addition, in the following detailed description, for ease of explanation, many specific details are set forth to provide a comprehensive understanding of the embodiments of the present disclosure. Obviously, however, one or more embodiments may be practiced without these specific details.

It is to be understood that, although terms such as first, second, or the like may be used herein to describe different elements, these elements should not be limited by these terms. These terms are only used to distinguish one element from another element. For example, without departing from the scope of the exemplary embodiments, a first element may be named a second element, and similarly, a second element may be named a first element. A term "and/or" as used herein includes any and all combinations of one or more associated listed items.

It is to be understood that, when an element or a layer is referred to as being "formed on" another element or layer, the element or the layer may be directly or indirectly formed on the other element or layer. That is, for example, there may be an intermediate element or an intermediate layer. In contrast, when an element or a layer is referred to as being "formed directly on" another element or layer, there are no intermediate elements or intermediate layers. Other words used to describe a relationship between elements or layers should be interpreted in a similar manner (for example, "between" and "directly between", "adjacent" and "directly adjacent", etc.).

Any terminology used herein only aims to describe specific embodiments and is not intended to limit the embodiments. As used herein, singular forms are intended to include plural forms as well, unless the context clearly indicates otherwise. It will also be understood that, when terms "comprising" and/or "including" are used herein, it only expresses that there are listed features, integers, steps, operations, elements and/or components, but it does not exclude that there are one or more other additional features, integers, steps, operations, elements components and/or combinations thereof.

In this context, unless otherwise specified, an expression "thickness" refers to a dimension of a layer or an element in a direction perpendicular to an upper surface of the substrate (in use, the upper surface of the substrate is a surface of the substrate facing the user).

In this context, unless otherwise specified, an expression "located in the same layer" generally means that a first component and a second component may be formed of the same material and may be formed through the same patterning process. For example, an expression "a first electrode layer and a second gate electrode are located in the same layer" generally means that the first electrode layer and the second gate electrode may be formed of the same material and may be formed through the same patterning process.

FIG. 1 is a schematic structural view of a photosensitive device according to some embodiments of the present disclosure. For example, the photosensitive device according to the embodiments of the present disclosure may be applied to an X-ray detection technology and an optical fingerprint recognition technology, which will be described in further detail hereinafter. As shown in FIG. 1, a photosensitive device 100 according to some embodiments of the present disclosure may be formed on a substrate 200, and it may include a photosensitive element 1 and a thin film transistor 3. For example, the photosensitive element 1 may be a photosensitive element that detects visible light. After the photosensitive element 1 detects visible light, it converts the visible light into an electrical signal, and then transmits the electrical signal to the thin film transistor 3. The thin film transistor 3 may receive the electrical signal and output the electrical signal, for example, to a monitor so as to display an image or to a processor so as to identify fingerprint. It should be understood that the photosensitive element in the embodiments of the present disclosure is not limited to detecting visible light. In other embodiments, the photosensitive element may also be a photosensitive element that detects non-visible light such as infrared light.

For example, the photosensitive element 1 may be a photodiode, which may have a PIN structure. As shown in FIG. 1, the photosensitive element 1 may include a first electrode layer 11, a first semiconductor layer (for example, a P-type amorphous silicon layer) 12, an intrinsic semiconductor layer (for example, an intrinsic amorphous silicon layer) 13, a second semiconductor layer (for example, an N-type amorphous silicon layer) 14 and a second electrode layer 15 which are disposed in a stack manner. The first semiconductor layer 12, the intrinsic semiconductor layer 13 and the second semiconductor layer 14 constitute the PIN structure for implementing photoelectric conversion, and therefore, they may be collectively referred to as a photoelectric conversion layer. An expression "disposed in a stack manner" here means that the first electrode layer 11, the first semiconductor layer 12, the intrinsic semiconductor layer 13, the second semiconductor layer 14 and the second electrode layer 15 are sequentially formed on the substrate 200, that is, the first electrode layer 11 is disposed on a side of the photoelectric conversion layer close to the substrate 200, and the second electrode layer 15 is disposed on a side of the photoelectric conversion layer distal to the substrate 200. Therefore, the first electrode layer 11 may also be referred to as a lower electrode of the photosensitive element 1 and the second electrode layer 15 may also be referred to as an upper electrode of the photosensitive element 1.

For example, the thin film transistor 3 may have a dual-gate electrode structure that is, the thin film transistor 3 is a dual-gate TFT. As shown in FIG. 1, the thin film transistor 3 may include a first gate electrode 31, a gate insulating layer 32, an active layer 33, a source-drain electrode layer, an interlayer insulating layer 36, and a second gate electrode 37 disposed in a stack manner. The source-drain electrode layer includes a source electrode 34 and a drain electrode 35. The expression "disposed in a stack manner" here means that the first gate electrode 31, the gate insulating layer 32, the active layer 33, the source-drain electrode layer, the interlayer insulating layer 36 and the second gate electrode 37 are sequentially formed on the substrate 200, that is, the first gate electrode 31 is disposed on a side of the active layer 33 close to the substrate 200, more specifically, on a side of the gate insulating layer 32 close to the substrate 200, and the second gate electrode 37 is disposed on a side of the active layer 33 distal to the substrate 200, more specifically, on a side of the interlayer insulating layer 36 distal to the substrate 200. The thin film transistor 3 has a bottom-gate electrode structure and a top-gate electrode structure, that is, it has a dual-gate electrode structure.

Referring to FIG. 1, the first electrode layer 11 of the photosensitive element 1 and the second gate electrode 37 of the thin film transistor 3 are located in the same layer. That is, the first electrode layer 11 and the second gate electrode 37 may be formed of the same material and formed through the same patterning process, so as to help to save the number of patterning processes, thereby reducing a complexity of the manufacturing process and reducing the manufacturing cost.

For example, a material constituting the first electrode layer 11 and the second gate electrode 37 may include metals such as Mo, Al, Cu, and alloys thereof.

For example, the first electrode layer 11 of the photosensitive element 1 is electrically connected to the source electrode 34 or the drain electrode 35 of the thin film transistor 3. As shown in FIG. 1, the first electrode layer 11 is formed on the source electrode 34, that is, the first electrode layer 11 is located on a side of the source electrode 34 distal to the substrate 200, and an orthographic projection of the first electrode layer 11 on the substrate 200 falls within an orthographic projection of the source electrode 34 on the substrate 200, and a surface (a lower surface in FIG. 1) of the first electrode layer 11 facing the source electrode 34 contacts a surface (an upper surface in FIG. 1) of the source electrode 34 facing the first electrode layer 11, thereby achieving an electrical contact between the first electrode layer 11 and the source electrode 34. In this way, when the photosensitive element 1 detects light, it converts the optical signal into an electrical signal, and then transmits the electrical signal to the source electrode 34 of the thin film transistor 3, then the thin film transistor 3 outputs the electrical signal from the drain electrode 35, for example, to a detection substrate, a processor or a controller of a display device.

In some embodiments of the present disclosure, the thin film transistor includes a second gate electrode located above the active layer, and the second gate electrode may effectively block light above the photosensitive device, such as light from a light emitting unit of a display component or light reflected by a fingerprint, thereby reducing an irradiation of light on a channel region of the thin film transistor and improving a stability of the thin film transistor.

In the embodiment of the present disclosure, the thin film transistor of the photosensitive device includes the dual-gate electrode structure, so that both the stability of the thin film transistor and a uniformity of a threshold voltage (Vth) are improved, thereby improving a performance of the photosensitive device.

For example, the active layer 33 of the thin film transistor 3 may include an oxide semiconductor material, a polysilicon semiconductor material (such as low-temperature polysilicon), or an amorphous silicon semiconductor material, or a non-silicon-based semiconductor material such as a carbon nanotube. In the embodiments of the present disclosure, the active layer 33 of the thin film transistor 3 may be formed of the oxide semiconductor, that is, the thin film transistor 3 may be an oxide thin film transistor (that is, oxide TFT). For example, the active layer 33 may include a ZnO-based oxide layer. In this case, the active layer 33 may further include a Group III element such as In or Ga, a Group IV element such as Sn, a combination thereof, or other elements. As another example, the active layer 3 may include a Cu oxide layer ($CuBO_2$ layer, $CuAlO_2$ layer, $CuGaO_2$ layer, $CuInO_2$ layer, etc.), a Ni oxide layer, a Ni oxide layer doped with Ti, a ZnO-based oxide layer doped with at least one of a Group I element, a Group II element and a Group V element, a ZnO-based oxide layer doped with Ag, a PbS layer, a LaCuOS layer, or a LaCuOSe layer. As an example, the active layer 33 may include indium gallium zinc oxide (abbreviated as IGZO), indium tin zinc oxide (abbreviated as ITZO), or indium zinc oxide (abbreviated as IZO).

In the embodiments of the present disclosure, the first gate electrode 31 and the second gate electrode 37 of the thin film transistor 3 may be driven by the same one signal. The inventor has found through researches that, by designing the thin film transistor 3 to have the dual-gate electrode structure and the active layer composed of the oxide semiconductor material, the stability of the thin film transistor and the uniformity of the threshold voltage (Vth) may be further improved, thereby further improving the performance of photosensitive device.

Specifically, for example, the substrate 200 may be a rigid substrate or a flexible substrate, such as a glass substrate or a plastic substrate.

For example, the first gate electrode 31 of the thin film transistor 3 may be disposed on a part of the upper surface of the substrate 200. Materials constituting the first gate electrode 31 may include metals such as Mo, Al, Cu, and alloys thereof. A thickness of the first gate electrode 31 may be in a range of 200 to 400 nm.

The gate insulating layer 32 of the thin film transistor 3 may be disposed on the upper surface of the substrate 200 and covers the first gate electrode 31. The gate insulating layer 32 may include an insulating material film layer formed of silicon nitride, silicon oxide, aluminum oxide, or the like, and may also include laminated material film layers formed of silicon nitride, silicon oxide, or the like. A thickness of the gate insulating layer 32 may be in a range of 150 to 450 nm.

The active layer 33 of the thin film transistor 3 may be disposed on a side of the gate insulating layer 32 distal to the substrate 200. The active layer 33 may include a source region 331, a channel region 332, and a drain region 333. The channel region 332 is located between the source region 331 and the drain region 333. As shown in FIG. 1, an orthographic projection of the channel region 332 on the substrate 200 falls within an orthographic projection of each of the first gate electrode 31 and the second gate electrode 37 on the substrate 200.

The source-drain electrode layer (i.e., the source electrode 34 and the drain electrode 35) of the thin film transistor 3 may be disposed on a side of the active layer 33 distal to the substrate 200. Materials constituting the source electrode 34 and the drain electrode 35 may include metals such as Mo, Al, Cu, and alloys thereof, that is, the material constituting the source electrode 34 and the drain electrode 35 may be the same as the material constituting the first gate electrode 31. The source electrode 34 may be in contact with the source region 331 and the drain electrode 35 may be in contact with the drain region 333.

The interlayer insulating layer 36 of the thin film transistor 3 may be disposed on a side of the source-drain electrode layer distal to the substrate 200. The interlayer insulating layer 36 may include an insulating material film layer formed of silicon nitride, silicon oxide, aluminum oxide, or the like, and may also include laminated material film layers formed of silicon nitride, silicon oxide, or the like. A thickness of the interlayer insulating layer 36 may be in a range of 300 to 500 nm.

Figure 2:
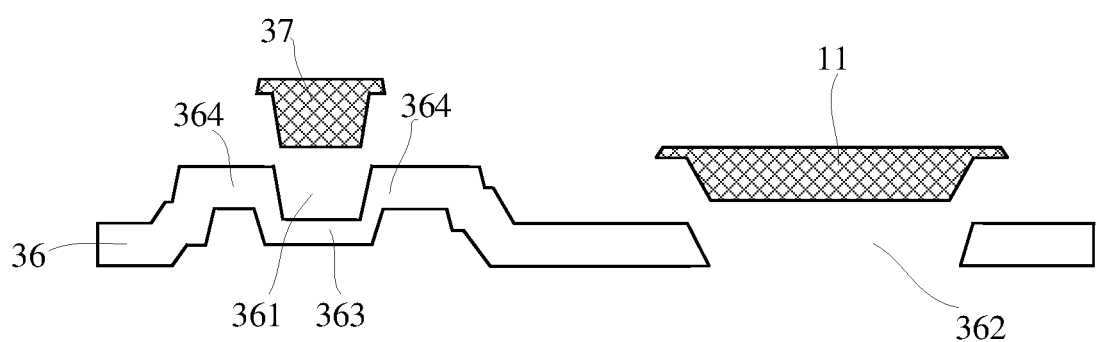
FIG. 2 is a partially enlarged view of a photosensitive device according to some embodiments of the present disclosure.

With reference to FIGS. 1 and 2 in combination, the interlayer insulating layer 36 may include a first recess 361 and a first via hole 362. It should be understood that, by partially removing the thickness of a part of the interlayer insulating layer 36 corresponding to the channel region 332, the first recess 361 may be formed in the interlayer insulating layer 36. Accordingly, in this context, for convenience of description, a part of the interlayer insulating layer 36 located above the channel region 332 is referred to as a first portion 363 of the interlayer insulating layer 36, and a part of the interlayer insulating layer 36 located above the source region 331, the drain region 333, the source electrode 34 and the drain electrode 35 is referred to as a second portion 364 of the interlayer insulating layer 36. Any two ones of an orthographic projection of the first recess 361 on the substrate 200, an orthographic projection of the first portion 363 on the substrate 200, and an orthographic projection of the channel region 332 on the substrate 200 at least partially overlap with each other. An orthographic projection of the second portion 364 on the substrate 200 at least partially overlaps with an orthographic projection of the source region 331 or the drain region 333 on the substrate 200. In other words, the orthographic projection of the second portion 364 on the substrate 200 falls within an orthographic projection of a combination of the source electrode 34 and the drain electrode 35 on the substrate 200. The second gate electrode 37 of the thin film transistor 3 is filled in the first recess 361, that is, at least a part of the second gate electrode 37 may be disposed in the first recess 361. As shown in FIG. 1, the second gate electrode 37 is located on a side of the first portion 363 distal to the active layer 33. Any two ones of the orthographic projection of the second gate electrode 37 on the substrate 200, the orthographic projection of the first portion 363 on the substrate 200 and the orthographic projection of the channel region 332 on the substrate 200 at least partially overlaps with each other. In this way, the first portion 363 of the interlayer insulating layer 36 is sandwiched between the active layer 33 and the second gate electrode 37 to form a gate insulating layer of the second gate electrode 37.

In the embodiments of the present disclosure, a thickness of the first portion 363 of the interlayer insulation layer 36 may be smaller than a thickness of the second portion 364 of the interlayer insulation layer 36. For example, the thickness of the second portion 364 of the interlayer insulation layer 36 may be in a range of 300 to 500 nm, and the thickness of the first portion 363 of the interlayer insulating layer 36 may be in a range of 100 to 200 nm. In this way, the second gate electrode 37 (i.e., top gate electrode) of the thin film transistor may provide an enhanced voltage driving effect on the channel region, thereby improving the performance of the thin film transistor.

It should be understood that the first via hole 362 may be formed in the interlayer insulating layer 36 by completely removing the thickness of a part of the interlayer insulating layer 36 corresponding to the first electrode layer 11 of the photosensitive element 1. The first electrode layer 11 of the photosensitive element 1 is filled in the first via hole 362, that is, at least a part of the first electrode layer 11 may be disposed in the first via hole 362. Referring to FIG. 1, the source-drain electrode layer of the thin film transistor extends to a position below the photosensitive element 1, and the first via hole 362 exposes the source-drain electrode layer, for example, exposes the source electrode 34 of the thin film transistor 3. That is, an orthographic projection of the first via hole 362 on the substrate 200 falls within the orthographic projection of the source electrode 34 on the substrate 200, and accordingly, an orthographic projection of the first electrode layer 11 on the substrate 200 falls within the orthographic projection of the source electrode 34 on the substrate 200. In this way, the first electrode layer 11 may be in contact with the source electrode 34 of the thin film transistor 3, thereby achieving an electrical connection between the first electrode layer 11 of the photosensitive element 1 and the thin film transistor.

As shown in FIG. 1, the photoelectric conversion layer may be disposed on the first electrode layer 11, for example, on a surface of the first electrode layer 11 distal to the substrate 200. The photoelectric conversion layer may be used to convert an optical signal into an electrical signal when it is illuminated with light. The photoelectric conversion layer may include a first semiconductor layer 12, an intrinsic semiconductor layer 13, and a second semiconductor layer 14.

For example, the first semiconductor layer 12 may be a semiconductor layer which is formed of N-type/P-type doped semiconductor materials such as amorphous silicon, amorphous germanium, and compounds thereof, or may directly include semiconductor materials such as silicon, germanium, and compounds thereof, or may include semiconductor materials such as IGZO, ZnO, and ITGO. The first semiconductor layer 12 may be disposed on the first electrode layer 11, for example, on a surface of the first electrode layer 11 distal to the substrate 200. The first semiconductor layer 12 may be formed by a process such as vapor deposition, evaporation, and doping, which is not particularly limited herein.

The intrinsic semiconductor layer 13 may include semiconductor materials such as amorphous silicon, amorphous germanium, and compounds thereof, and may be disposed on a side of the first semiconductor layer 12 distal to the first electrode layer 11, for example, on a surface of the first semiconductor layer 12 distal to the first electrode layer 11, and may be formed by a process such as vapor deposition and evaporation.

The second semiconductor layer 14 may be a semiconductor layer which is formed of N-type/P-type doped semiconductor materials such as silicon, germanium, and compounds thereof, or may directly include semiconductor materials such as silicon, germanium, and compounds thereof, or may include semiconductor materials such as IGZO and ZnO. The second semiconductor layer 14 may be disposed on a side of the intrinsic semiconductor layer 13 distal to the first electrode layer 11, for example, on a surface of the intrinsic semiconductor layer 13 distal to the first electrode layer 11, and may be formed by a process such as vapor deposition, evaporation, and doping.

It should be noted that, if the first semiconductor layer 12 is an N-type semiconductor layer, the second semiconductor layer 14 is a P-type semiconductor layer; if the first semiconductor layer 12 is a P-type semiconductor layer, the second semiconductor layer 14 is an N-type semiconductor layer. As an example, the first semiconductor layer 12 may be an N-type doped amorphous silicon layer and a thickness thereof may be in range of 10 to 100 nm. The intrinsic semiconductor layer 13 may be an intrinsic amorphous silicon layer and a thickness thereof may be in a range of 600 to 1200 nm. The second semiconductor layer 14 may be a P-type doped amorphous silicon layer, and a thickness thereof may be in a range of 10 to 100 nm.

As shown in FIG. 1, the second electrode layer 15 may be disposed on a side of the second semiconductor layer 14 distal to the substrate 200. The material constituting the second electrode layer 15 may include a transparent conductive material, such as indium tin oxide (abbreviated as ITO). For example, a thickness of the second electrode layer 15 may be in range of 20 to 80 nm to allow light pass through it.

As shown in FIG. 1, the photosensitive device 100 may further include an overcoating layer 7. The overcoating layer 7 is disposed on a side of the second electrode layer 15 of the photosensitive element 1 and the second gate electrode 37 of the thin film transistor 3 distal to the substrate 200. The overcoating layer 7 covers both the photosensitive element 1 and the thin film transistor 3, that is, an orthographic projection of the overcoating layer 7 on the substrate 200 covers an orthographic projection of a combination of the photosensitive element 1 and the thin film transistor 3 on the substrate 200. The overcoating layer 7 may be made of a transparent and insulating material. For example, the material constituting the overcoating layer 7 may include inorganic materials such as silicon oxide and silicon oxynitride. The overcoating layer 7 covers a surface of the second electrode layer 15 distal to the substrate 200, and also covers side surfaces of the photoelectric conversion layers 12, 13, 14, so that the second electrode layer 15 and the photoelectric conversion layer may be protected. Advantageously, the first semiconductor layer 12, the intrinsic semiconductor layer 13, and the second semiconductor layer 14 are protected from water, oxygen, and the like.

The overcoating layer 7 may further include a second via hole 71 and a third via hole 73. The second via hole 71 exposes a part of the second electrode layer 15, that is, an orthographic projection of the second via hole 71 on the substrate 200 falls within an orthographic projection of the second electrode layer 15 on the substrate 200. The third via hole 73 exposes a part of the second gate electrode 37, that is, an orthographic projection of the third via hole 73 on the substrate 200 falls within an orthographic projection of the second gate electrode 37 on the substrate 200.

As shown in FIG. 1, the photosensitive device 100 may further include a first electrode lead 8 and a second electrode lead 9. The first electrode lead 8 and the second electrode lead 9 may be located in the same layer. The first electrode lead 8 and the second electrode lead 9 may be disposed on a side of the overcoating layer 7 distal to the substrate 200. For example, the material constituting the first electrode lead 8 and the second electrode lead 9 may include metals such as Mo, Al, Cu, and alloys thereof. A part of the first electrode lead 8 may be filled in the second via hole 71. In this way, the first electrode lead 8 may be electrically connected to the second electrode layer 15 of the photosensitive element 1, thereby leading out the second electrode layer 15. A part of the second electrode lead 9 may be filled in the third via hole 73. In this way, the second electrode lead 9 may be electrically connected to the second gate electrode 37 of the thin film transistor 3, thereby leading out the second gate electrode 37.

As shown in FIG. 1, the photosensitive device 100 may further include a passivation layer 10. The passivation layer 10 is disposed on a side of the first electrode lead 8 and the second electrode lead 9 distal to the substrate 200, and the passivation layer 10 covers both the first electrode lead 8 and the second electrode lead 9, that is, an orthographic projection of the passivation layer 10 on the substrate 200 covers an orthographic projection of a combination of the first electrode lead 8 and the second electrode lead 9 on the substrate 200. The passivation layer 10 may be made of a transparent and insulating material. For example, the material constituting the passivation layer 10 may include inorganic materials such as silicon oxide and silicon oxynitride.

Figure 3:
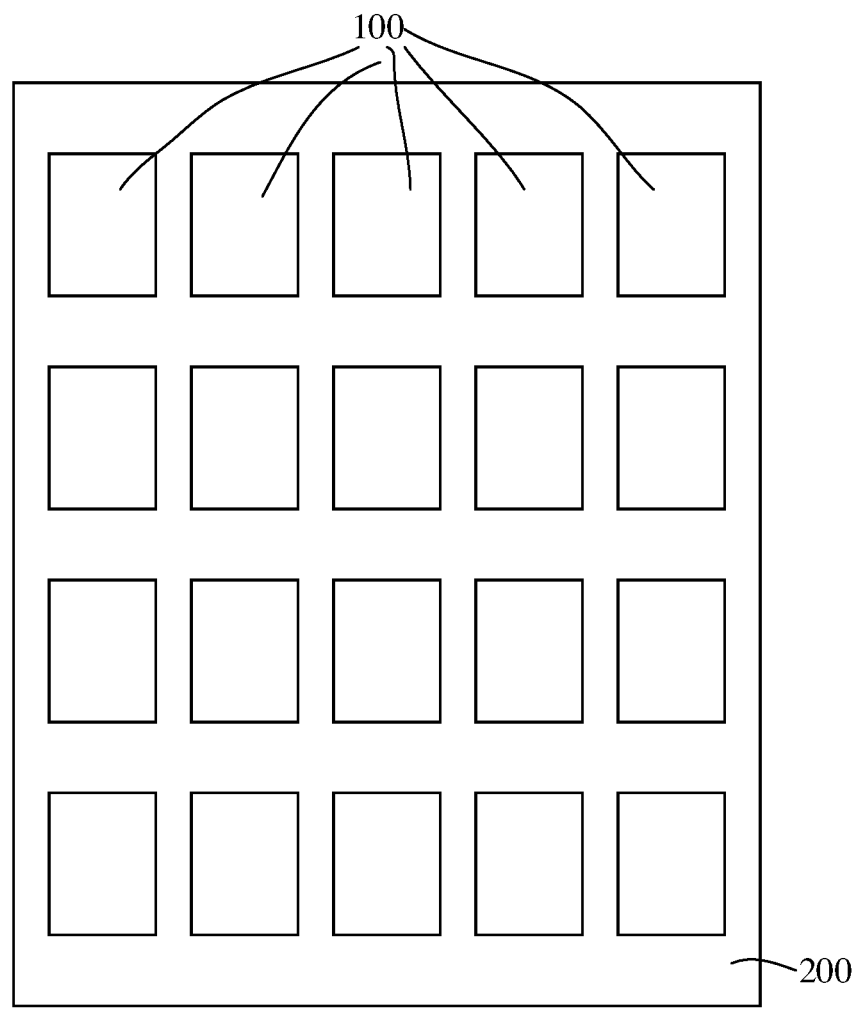
FIG. 3 is a plan view of a detection substrate according to some embodiments of the present disclosure.

FIG. 3 is a plan view of a detection substrate according to some embodiments of the present disclosure. With reference to FIG. 1 and FIG. 3, the detection substrate may include a substrate 200 and the photosensitive device 100 according to any one of the above embodiments. For example, the detection substrate may be used to detect X-ray. As shown in FIG. 2, there may be a plurality of the photosensitive devices 100. The plurality of the photosensitive devices 100 are disposed on the substrate 200 in an array. Each of the photosensitive devices 100 may convert the optical signal into the electrical signal.

When the detection substrate is in use, for example, the detection substrate may be irradiated with X-ray, and a scintillator layer (or phosphor layer) may convert the X-ray into visible light. Following the photosensitive element 1 of the photosensitive device 100 detects the visible light, the visible light is converted into the electrical signal. Then the electrical signal is transmitted to the thin film transistor 3. The thin film transistor 3 may receive the electrical signal and output the electrical signal to display an image by an image monitor, thereby realizing X-ray detection.

It should be understood that, since the detection substrate according to the embodiments of the present disclosure includes the photosensitive device described in any one of the above embodiments, it should include all the features and advantages of the photosensitive device described above, which may refer to the above description and are not repeated here.

Figure 4:
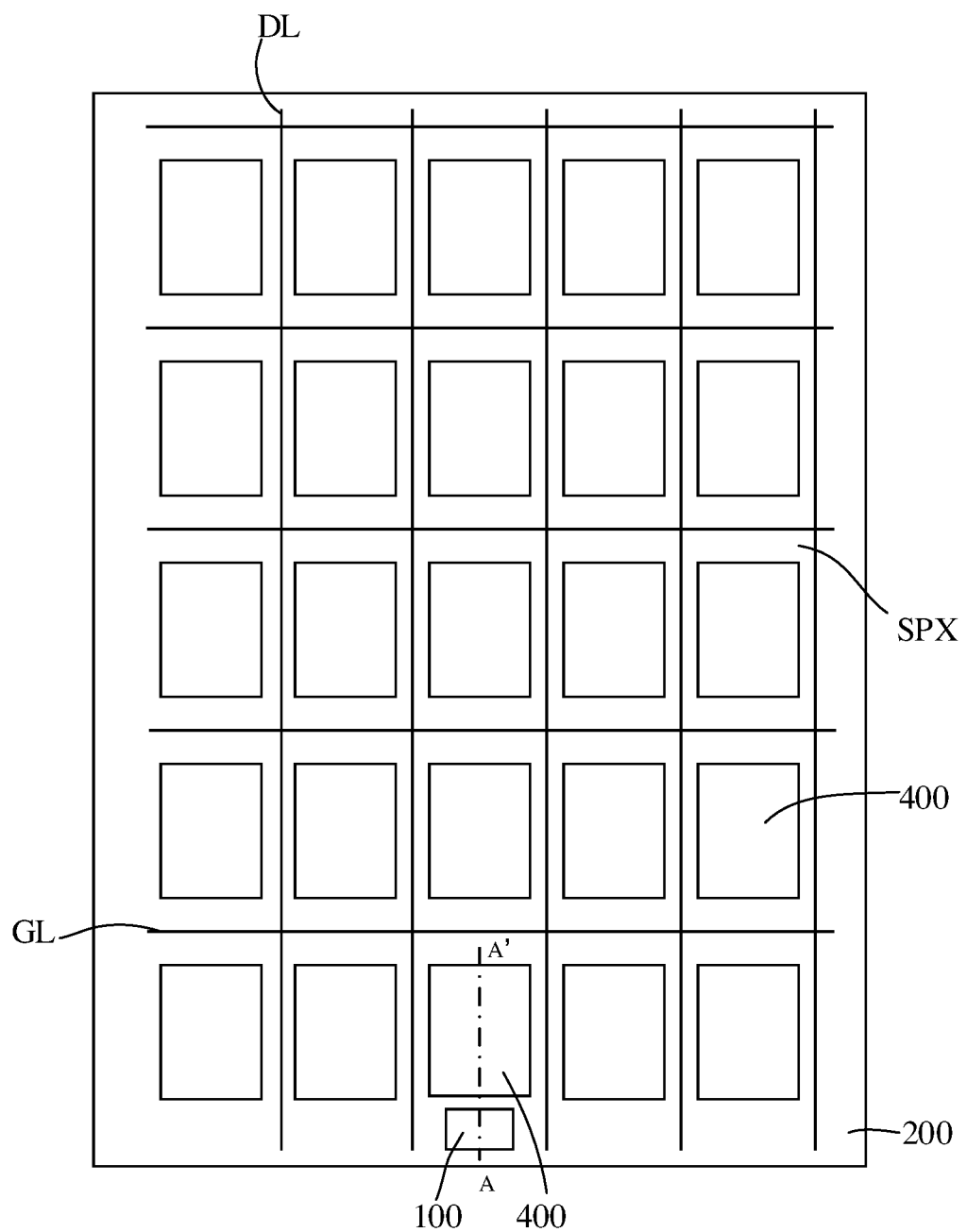
FIG. 4 is a plan view of an array substrate according to some embodiments of the present disclosure.
Figure 5:
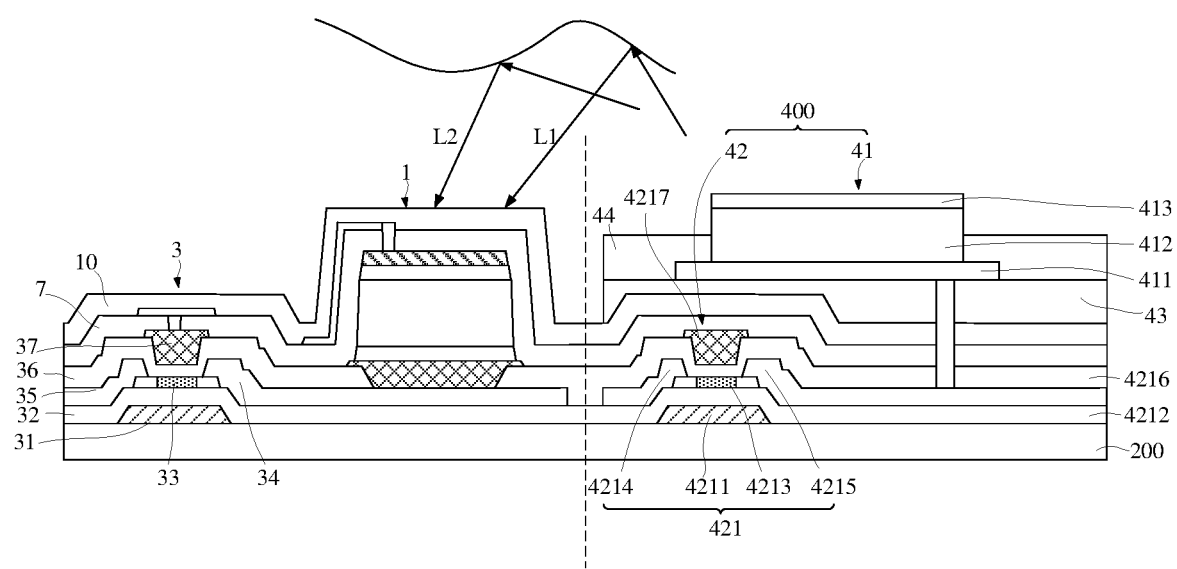
FIG. 5 is a cross-sectional view, which is taken along line AA' in FIG. 4, of the array substrate according to some embodiments of the present disclosure.

FIG. 4 is a plan view of an array substrate according to some embodiments of the present disclosure, and FIG. 5 is a cross-sectional view, taken along line AA' in FIG. 4, of the array substrate according to some embodiments of the present disclosure. Referring to FIG. 4, the array substrate may include a substrate 200, a plurality of scan lines GL and a plurality of data lines DL. The plurality of scan lines GL and the plurality of data lines DL cross with each other to form a plurality of sub-pixels SPX. Within at least one sub-pixel SPX, a display component 400 and a photosensitive device are provided, and the photosensitive device is the photosensitive device 100 according to any one of the embodiments described above. That is to say, the array substrate may include: a substrate 200; a plurality of sub-pixels SPX disposed on the substrate 200; a plurality of display components 400, the plurality of display components 400 are respectively disposed in the plurality of sub-pixels SPX; and at least one photosensitive device 100 in at least one sub-pixel SPX.

It should be noted that one photosensitive device 100 disposed in one sub-pixel may correspond to multiple display components 400 disposed in multiple sub-pixels SPX. Specifically, one photosensitive device 100 disposed in one sub-pixel may receive fingerprint-reflected light which is emitted from multiple display components 400 in multiple sub-pixels SPX and reflected by the fingerprint, thereby achieving a fingerprint recognition function.

For example, the array substrate according to some embodiments of the present disclosure may be an array substrate of a liquid crystal display device, or an array substrate of an OLED display device or a QLED display device. FIG. 5 illustrates a cross-sectional view of an array substrate according to some embodiments of the present disclosure. For example, the display device is an OLED display device, and a structure of only one sub-pixel is shown.

With reference to FIGS. 1, 4 and 5, the display component 400 may include an organic light emitting element 41 and a display driving element 42 electrically connected to the organic light emitting element 41. The display driving element 42 is configured to drive the organic light emitting element 41 to realize light emission for display.

Optionally, the organic light emitting element 41 may include an anode 411, a cathode 413, and a light emitting layer 412 located between the anode 411 and the cathode 413. For example, the OLED display unit may be a top emission type OLED display unit, the anode 411 may be a reflective electrode made of metal, and the cathode 413 may be a transparent electrode.

Optionally, the display driving element 42 may include a thin film transistor 421. Herein, for the purpose of distinction, the thin film transistor 3 of the photosensitive device 100 may be referred to as a first thin film transistor 3, and the thin film transistor 421 of the display driving element 42 may be referred to as a second thin film transistor 421.

For example, the second thin film transistor 421 may have the same structure as the first thin film transistor 3, that is, it may also have a dual-gate electrode structure, that is, it is also a dual-gate TFT. As shown in FIG. 5, the second thin film transistor 421 may include a first gate electrode 4211, a gate insulating layer 4212, an active layer 4213, a source-drain electrode layer, an interlayer insulating layer 4216, and a second gate electrode 4217 disposed in a stack manner. The source-drain electrode layer includes a source electrode 4214 and a drain electrode 4215. Similarly, the first gate electrode 4211 is disposed on a side of the active layer 4213 close to the substrate 200, more specifically, on a side of the gate insulating layer 4212 close to the substrate 200, and the second gate electrode 4217 is disposed on a side of the active layer 4213 distal to the substrate 200, and more specifically, on a side of the interlayer insulating layer 4216 distal to the substrate 200. The thin film transistor 421 has a bottom-gate electrode structure and a top-gate electrode structure, that is, it has a dual-gate electrode structure. More specific structure of the second thin film transistor 421 may refer to the above description of the first thin film transistor 3, and details are not described herein again.

As shown in FIG. 5, the drain electrode 4215 of the second thin film transistor 421 may be electrically connected to the anode 411 of the organic light emitting element 41, so as to drive the organic light emitting element 41 to realize light emission for display.

Referring to FIG. 5, when the fingerprint-reflected light (which is exemplified by light rays L1 and L2 in FIG. 5) is irradiated onto the photosensitive element 1 of the photosensitive device 100, a saturation reverse leakage current of the photosensitive element greatly increases, thereby forming a photocurrent. The photocurrent changes as an intensity of the fingerprint-reflected light changes. The first thin film transistor 3 of the photosensitive device 100 outputs a photocurrent signal to a signal line, thereby achieving a fingerprint recognition according to the photocurrent signal.

In the embodiments of the present disclosure, the thin film transistor includes a second gate electrode located above the active layer thereof, and the second gate electrode may effectively block light emitted from the organic light emitting element or the fingerprint-reflected light, thereby reducing light irradiation on the channel region of the thin film transistor. In this way, the stability of the thin film transistor is improved.

Optionally, the photosensitive element 1 of the photosensitive device 100 may be a photosensitive element capable of sensing visible light. The organic light emitting element 41 of the display component 400 may be used as a light source of the photosensitive device 100. The photosensitive device 100 is configured to perform the fingerprint recognition according to the light which is emitted from the organic light emitting element 41 of the display component 400 and reflected onto the photosensitive element 1 via a touch body. In this case, it is not necessary to provide an individual light source for the photosensitive device 100.

Referring to FIG. 5, an orthographic projection of the photosensitive device 100 on the substrate 200 does not overlap with an orthographic projection of the display component 400 on the substrate 200. Specifically, an orthographic projection of the photosensitive element 1 of the photosensitive device 100 on the substrate 200 does not overlap with an orthographic projection of a light emitting area of the display component 400 on the substrate 200. In this way, the light emitted from the display component 400 during normal display will not directly irradiate onto the photosensitive element 1 of the photosensitive device 100, so that it may not affect adversely the fingerprint recognition function.

Optionally, the photosensitive element 1 of the photosensitive device 100 may be a photosensitive element capable of sensing non-visible light, for example, a photosensitive element capable of sensing infrared light.

For example, the first gate electrode 4211, the gate insulating layer 4212, the active layer 4213, the source-drain electrode layer, the interlayer insulating layer 4216 and the second gate electrode 4217 of the second thin film transistor 421 may be located in the same layer as the first gate electrode 31, the gate insulating layer 32, the active layer 33, the source-drain electrode layer, the interlayer insulating layer 36 and the second gate electrode 37 of the first thin film transistor 3, respectively. In this way, it is not required to add additional patterning processes to form the two thin film transistors, thereby facilitating manufacturing the array substrate and saving the manufacturing cost.

Referring to FIG. 5, the overcoating layer 7 and the passivation layer 10 also extend to the display component 400, that is, the orthographic projection of the display component 400 on the substrate 200 also falls within the orthographic projection of each of the overcoating layer 7 and the passivation layer 10 on the substrate 200.

Optionally, the array substrate may further include a planarization layer 43 and a pixel defining layer 44. The planarization layer 43 is disposed on a side of the passivation layer 10 distal to the substrate 200. The pixel defining layer 44 is disposed on a side of the planarization layer 43 distal to the substrate 200. The pixel defining layer 44 defines an opening, and the organic light emitting element 41 is located in the opening.

It should be understood that, since the array substrate according to the embodiments of the present disclosure includes the photosensitive device described in any one of the above embodiments, it may include all the features and advantages of the photosensitive device described above, which may refer to the above description and are not repeated herein again.

Optionally, some embodiments of the present disclosure further provide a display device, which may include the above-mentioned array substrate. The display device may include, but is not limited to, any product or component having a display function, such as electronic paper, mobile phone, tablet computer, television, display, notebook computer, digital photo frame, and navigator. It should be understood that the display device may have the same beneficial effects as the array substrate provided by the foregoing embodiments.

Figure 6:
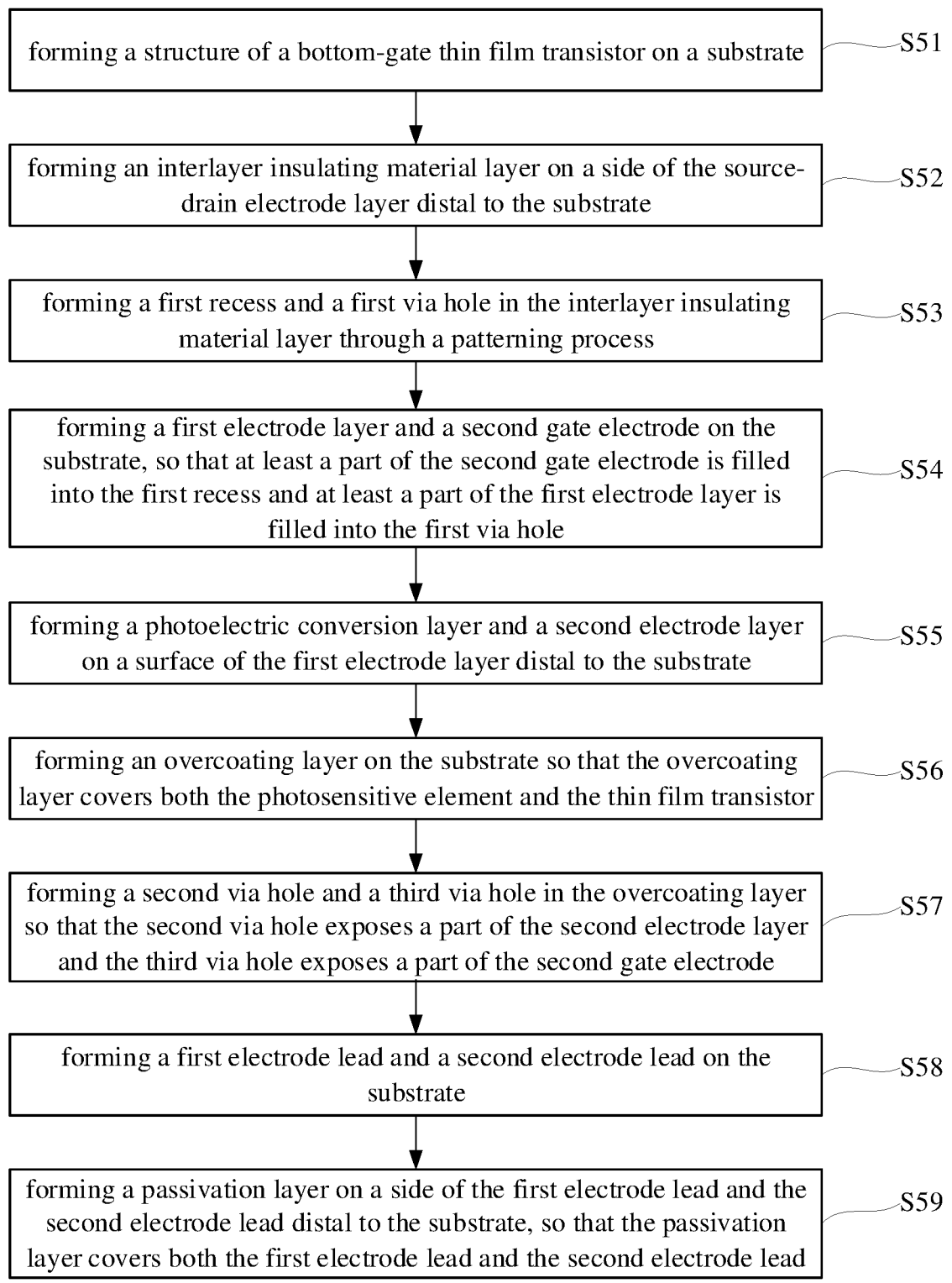
FIG. 6 is a flowchart of a method for manufacturing a photosensitive device according to some embodiments of the present disclosure.

FIG. 6 is a flowchart of a method for manufacturing a photosensitive device according to some embodiments of the present disclosure, and FIG. 7 to FIG. 17 schematically illustrate cross-sectional views of structures formed after main steps of the method for manufacturing the photosensitive device according to some exemplary embodiments of the present disclosure are performed, respectively. Hereinafter, the method for manufacturing the photosensitive device according to the exemplary embodiments of the present disclosure will be described in detail with reference to FIG. 6 and FIG. 7 to FIG. 17.

Figure 7:
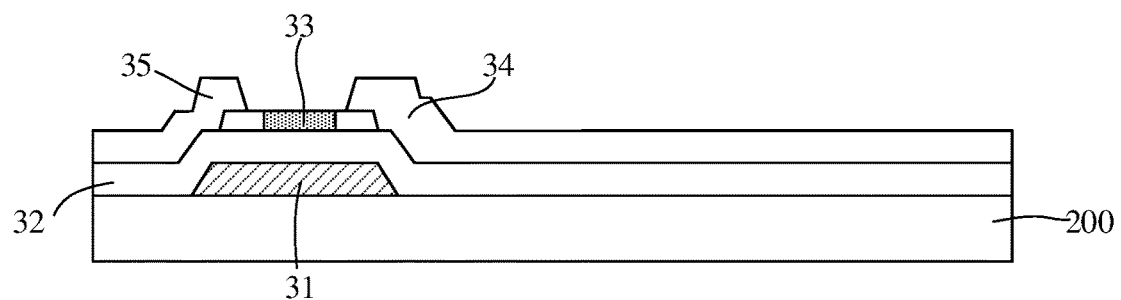
FIG. 7, FIG. 8, FIG. 9A to FIG. 9C, FIG. 10, FIG. 11A to FIG. 11C, and FIG. 12 to FIG. 17 schematically illustrate cross-sectional views of structures formed after main steps of a method for manufacturing a photosensitive device according to some exemplary embodiments of the present disclosure are performed, respectively.

In step SM, referring to FIG. 7, a structure of a bottom-gate thin film transistor is formed on a substrate 200. For example, processes similar to forming a BCE (back channel etching) type TFT may be used to sequentially form a first gate electrode 31, a gate insulating layer 32, an active layer 33, and a source-drain electrode layer 34, 35 on the substrate 200.

It should be noted that the embodiments of the present disclosure are not limited to the BCE process. In other embodiments, processes similar to forming an ESL (etch stop layer) TFT may be used to form the structure of the bottom-gate thin film transistor on the substrate 200.

Figure 8:
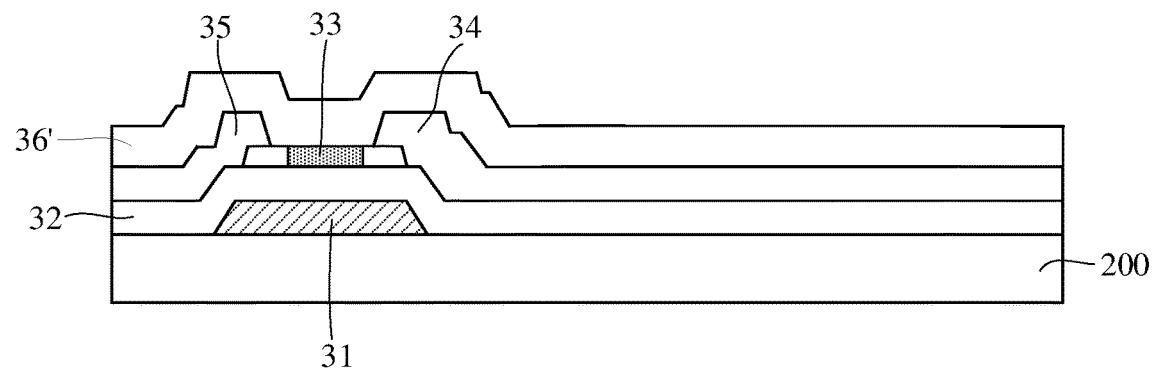

In step S52, referring to FIG. 8, an interlayer insulating material layer 36' is formed on a side of the source-drain electrode layer distal to the substrate 200. For example, the interlayer insulating material layer 36' may include an inorganic insulating material film layer formed of silicon nitride, silicon oxide, aluminum oxide, or the like, or may include laminated material film layers formed of silicon nitride, silicon oxide, or the like. The thickness of the interlayer insulating material layer 36' may be in a range of 300 to 500 nm.

In step S53, a first recess 361 and a first via hole 362 are formed in the interlayer insulating material layer 36' through a patterning process.

Figure 9A:
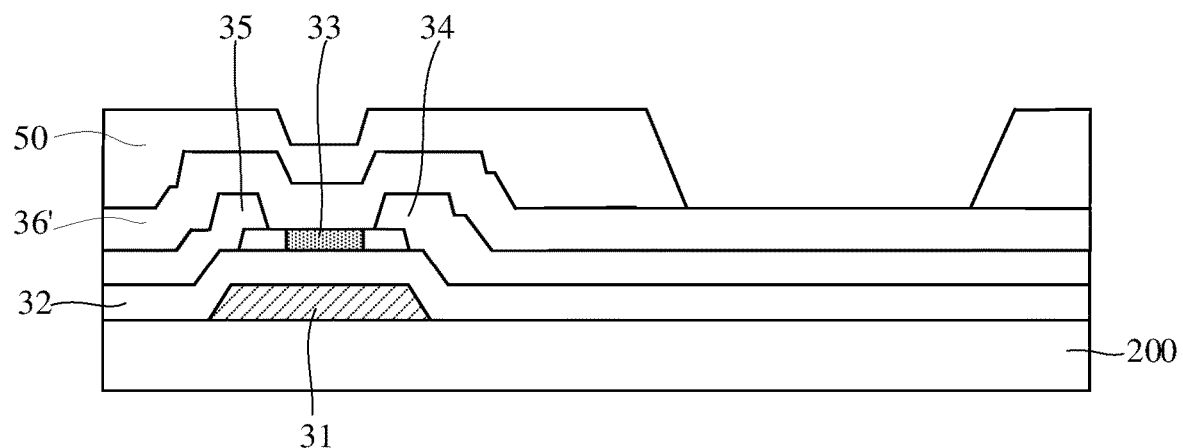
Figure 9B:
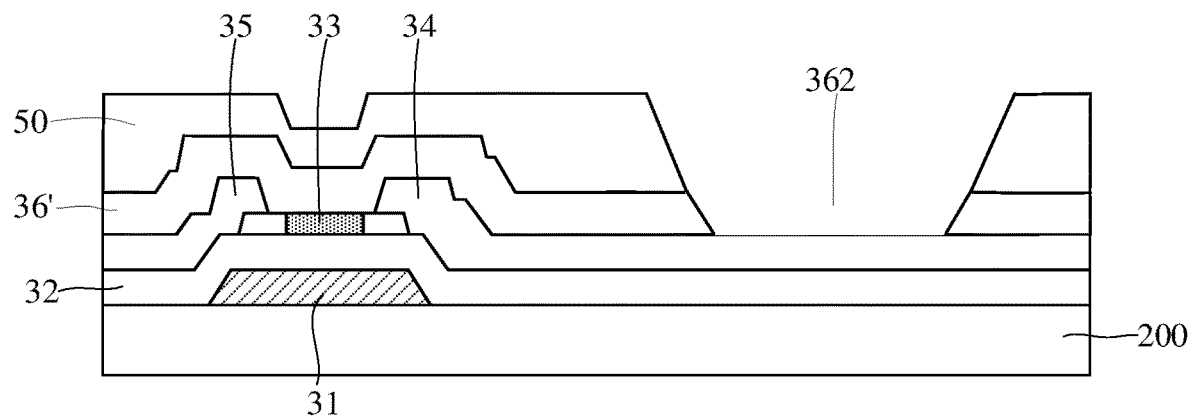
Figure 9C:
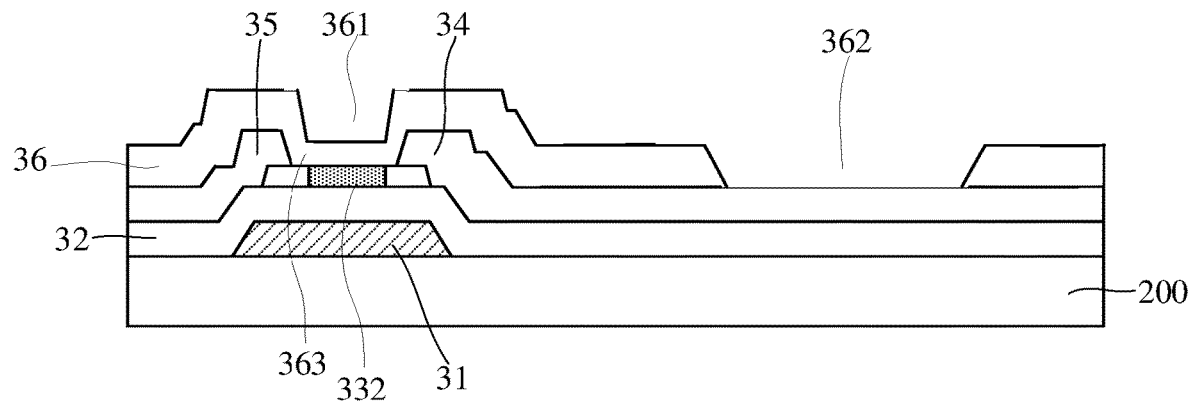

For example, a surface of the interlayer insulating material layer 36' distal to the substrate 200 may be coated with a photoresist layer 50, and then a half-exposure mask technology, such as a gray tone mask, is used to expose and develop the photoresist layer 50, so that the photoresist layer 50 has a pattern as shown in FIG. 9A, that is, a part of the photoresist layer 50 corresponding to the first via hole 362 to be formed is completely removed, and a part of the photoresist layer 50 corresponding to the first recess 361 to be formed is partially removed. Then, a first etching process is performed on the interlayer insulating material layer 36'. In the first etching process, since the interlayer insulating material layer 36' at a position of the first via hole 362 to be formed is completely exposed, the interlayer insulating material layer 36' at the position is completely etched off through the first etching process to form a first via hole 362, as shown in FIG. 9B. Then, an ashing process is performed on the remaining photoresist layer 50 to completely expose a part of the interlayer insulating material layer 36' located above the channel region 332. Then, a second etching process is performed on the interlayer insulating material layer 36'. In the second etching process, etching rate and etching time are controlled to partially etch the part of the interlayer insulating material layer 36' located above the channel region 332, and the interlayer insulating material layer 36' with a certain thickness remains above the channel region 332. For example, the interlayer insulating material layer 36' with a thickness in a range of 100 to 200 nm remains above the channel region 332 to form a first recess 361 and a first portion 363 above the channel region 332, as shown in FIG. 9C.

Figure 10:
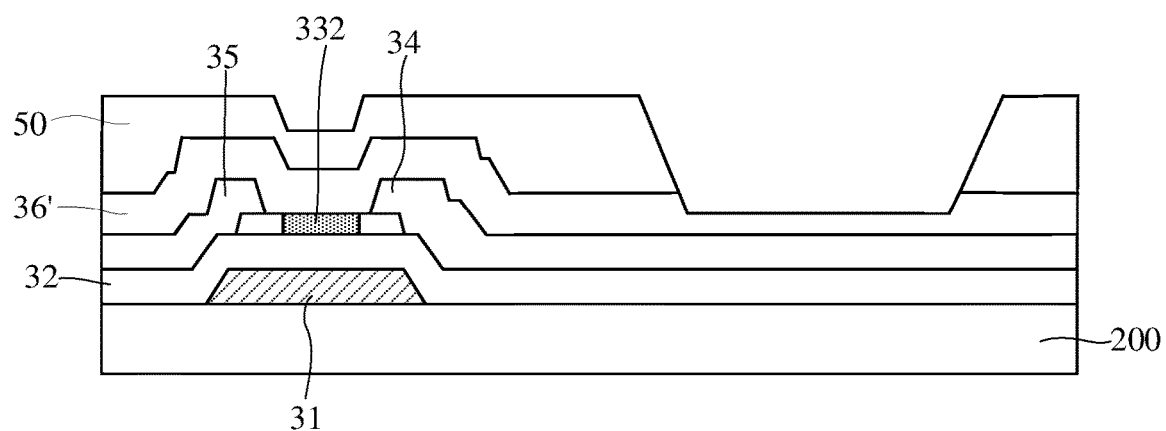

For another example, a surface of the interlayer insulating material layer 36' distal to the substrate 200 may be coated with a photoresist layer 50. Then, a half-exposure mask technology, such as a gray tone mask, may be used to expose and develop the photoresist layer 50, so that the photoresist layer 50 has a pattern as shown in FIG. 9A, that is, a part of the photoresist layer 50 corresponding to the first via hole 362 to be formed is completely removed and a part of the photoresist layer 50 corresponding to the first recess 361 to be formed is partially removed. Then, a first etching process is performed on the interlayer insulating material layer 36'. In the first etching process, the etching rate and the etching time are controlled to partially etch the interlayer insulating material layer 36' at a position corresponding to the first via hole 362 to be formed. For example, at the position corresponding to the first via hole 362 to be formed, the interlayer insulating material layer 36' with a thickness in a range of 100 to 200 nm may be etched off, as shown in FIG. 10. Then, an ashing process is performed on the remaining photoresist layer 50 to completely expose a part of the interlayer insulating material layer 36' located above the channel region 332. Then, a second etching process is performed on the interlayer insulating material layer 36'. In the second etching process, the interlayer insulating material layer 36' remaining at the position corresponding to the first via hole 362 to be formed is completely etched off while the part of the interlayer insulating material layer 36' located above the channel region 332 is partially etched off. In this way, the interlayer insulating material layer 36' with a certain thickness remains above the channel region 332. It should be understood that the thickness of the interlayer insulating material layer 36' remaining above the channel region 332 in the second etching process is substantially identical to the thickness of the interlayer insulating material layer 36' which is etched off at the position corresponding to the first via hole 362 to be formed in the first etching process. For example, the interlayer insulating material layer 36' with a thickness in a range of 100 to 200 nm remains above the channel region 332 to form a first recess 361 and a first portion 363 above the channel region 332, as shown in FIG. 9C.

In the above embodiments, the first recess 361 and the first via hole 362 may be formed in the interlayer insulating material layer 36' through one mask process, so that it is beneficial to reducing the use of the mask and saving manufacturing cost.

Figure 11A:
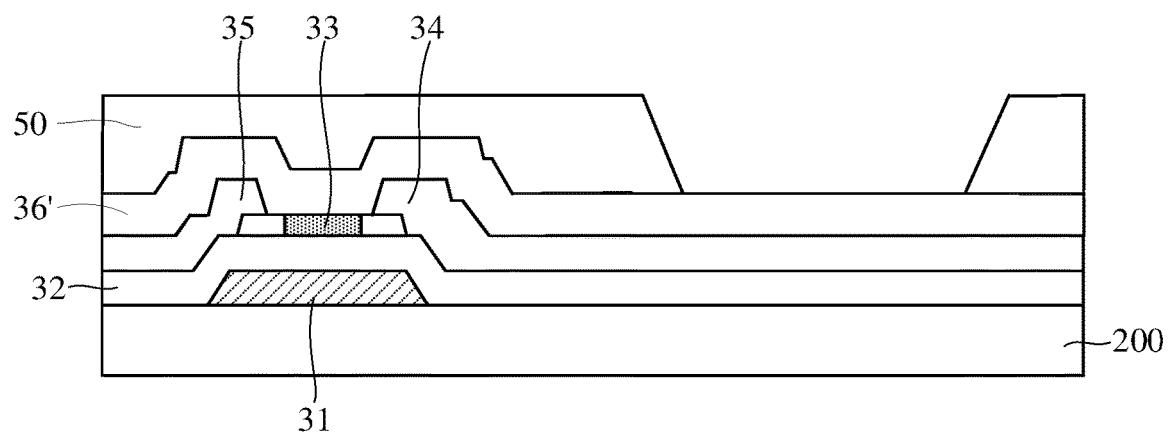
Figure 11B:
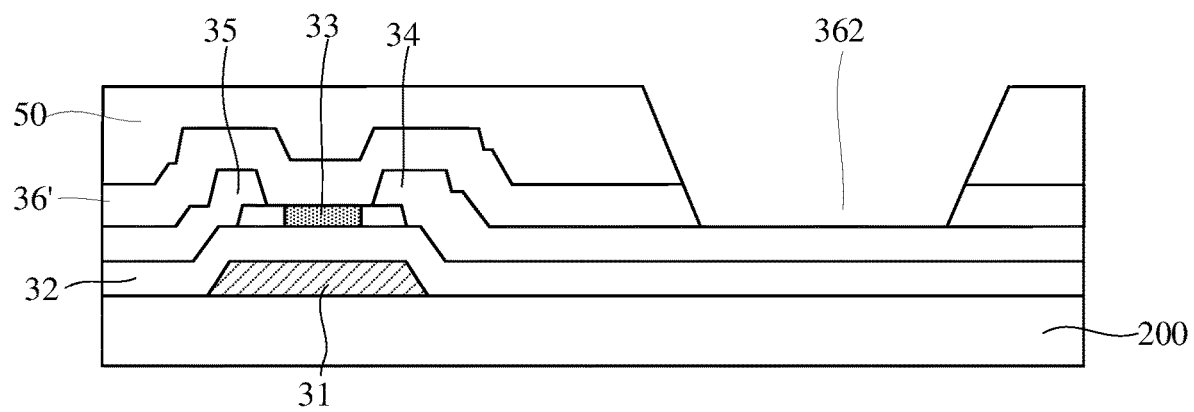
Figure 11C:
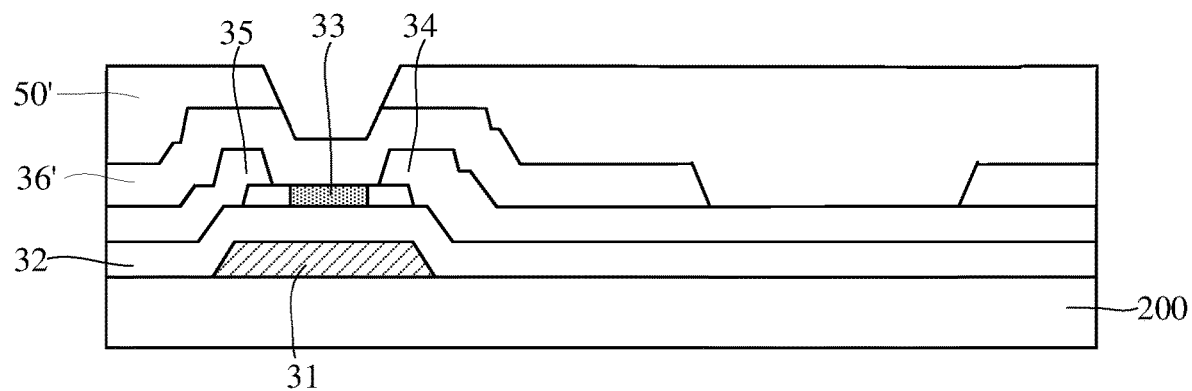

For example, a surface of the interlayer insulating material layer 36' distal to the substrate 200 may be coated with a photoresist layer 50. Then, a first mask process is performed on the photoresist layer 50 so that the photoresist layer 50 has a pattern as shown in FIG. 11A, that is, a part of the photoresist layer 50 corresponding to the first via hole 362 to be formed is completely removed. In this way, the interlayer insulating material layer 36' at a position corresponding to the first via hole 362 to be formed is completely exposed. Then, a first etching process is performed on the interlayer insulating material layer 36'. In the first etching process, the interlayer insulating material layer 36' at the position corresponding to the first via hole 362 to be formed is completely etched off to form the first via hole 362, as shown in FIG. 11B. Then, the photoresist layer 50 is removed. Then, the surface of the interlayer insulating material layer 36' distal to the substrate 200 is coated with a photoresist layer 50' again. Then, a second mask process is performed on the photoresist layer 50', so that the photoresist layer 50' has a pattern as shown in FIG. 11C, that is, a part of the photoresist layer 50' corresponding to the first recess 361 to be formed is completely removed. In this way, the interlayer insulating material layer 36' at a position corresponding to the first recess 361 to be formed is completely exposed. Then, a second etching process is performed on the interlayer insulating material layer 36'. In the second etching process, the etching rate and the etching time are controlled to partially etch a part of the interlayer insulating material layer 36' located above the channel region 332, and the interlayer insulating material layer 36' with a certain thickness remains above the channel region 332. For example, the interlayer insulating material layer 36' with a thickness in a range of 100 to 200 nm remains above the channel region 332 to form a first recess 361 and a first portion 363 above the channel region 332, as shown in FIG. 9C. Then, the photoresist layer 50' is removed.

Figure 12:
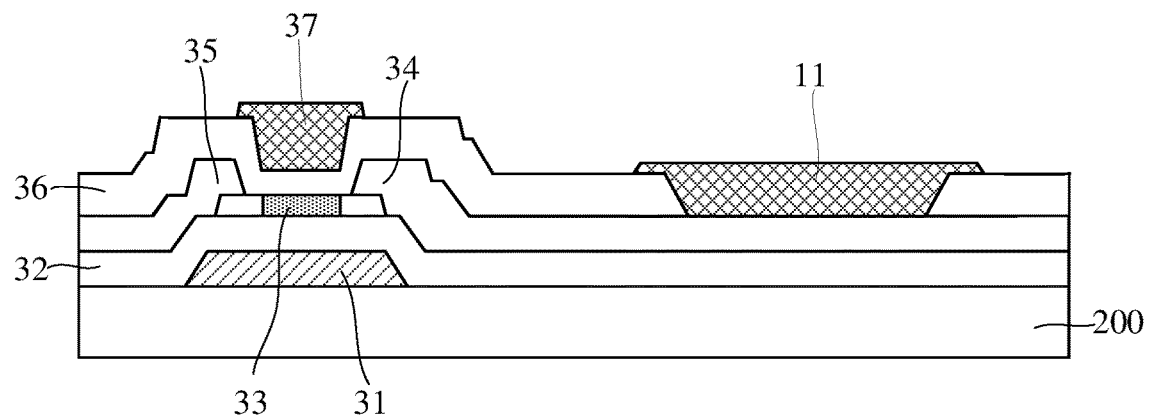

In step S54, the first electrode layer 11 and the second gate electrode 37 are formed on the substrate 200, so that at least a part of the second gate electrode 37 is filled into the first recess 361 and at least a part of the first electrode layer 11 is filled into the first via hole 362, as shown in FIG. 12.

For example, a deposition process such as sputtering may be used to deposit a metal material layer on the surface of the interlayer insulation layer 36 distal to the substrate 200, in the first recess 361, and in the first via hole 362. The metal material layer is made of one selected from metals such as Mo, Al, Cu and alloys thereof. Then, the metal material layer is patterned to form the first electrode layer 11 and the second gate electrode 37 through a patterning process in such a way that at least a part of the second gate electrode 37 is filled into the first recess 361 and at least a part of the first electrode layer 11 is filled into the first via hole 362. In this way, the thin film transistor 3 having a dual-gate electrode structure is formed on the substrate 200.

Figure 13:
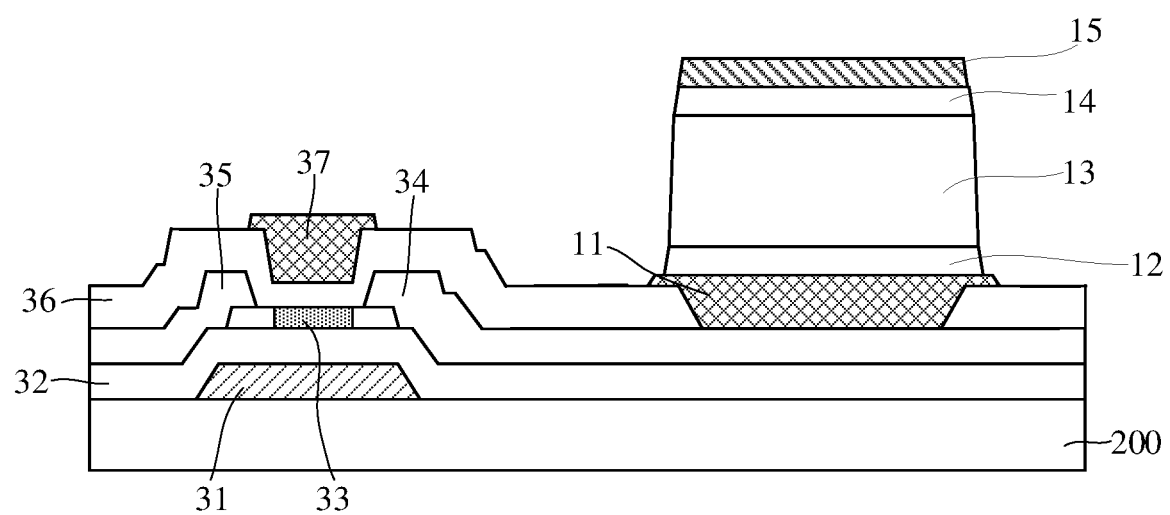

In step S55, a photoelectric conversion layer and a second electrode layer are formed on a surface of the first electrode layer 11 distal to the substrate 200. For example, a first semiconductor layer (such as a P-type amorphous silicon layer) 12, an intrinsic semiconductor layer (such as an intrinsic amorphous silicon layer) 13, and a second semiconductor layer (such as an N-type amorphous silicon layer) 14 and a second electrode layer 15 may be sequentially formed on a surface of the first electrode layer 11 distal to the substrate 200, as shown in FIG. 13. In this way, the photosensitive element 1 is formed on the substrate 200.

In some embodiments of the present disclosure, in a depositing process of depositing the PIN structure including the first semiconductor layer (such as P-type amorphous silicon layer) 12, the intrinsic semiconductor layer (such as intrinsic amorphous silicon layer) 13 and the second semiconductor layer (such as N-type amorphous layer) such as silicon layer) 14, H ions (H$^+$) may be generated. Since the second gate electrode 37 is formed above the channel region 332, the second gate electrode 37 may block a diffusion of the H ions to the channel region 332, thereby ensuring that the channel region of the thin film transistor will not become conductive, which is beneficial to maintaining the characteristics of the thin film transistor stable.

Figure 14:
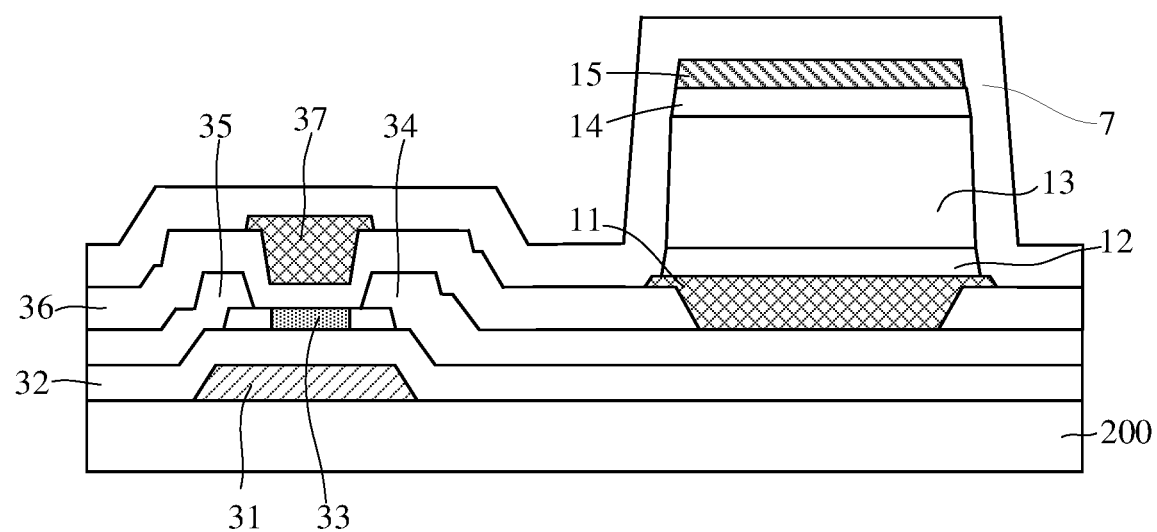

In step S56, as shown in FIG. 14, an overcoating layer 7 is formed on the substrate 200 so that the overcoating layer 7 covers both the photosensitive element 1 and the thin film transistor 3.

Figure 15:
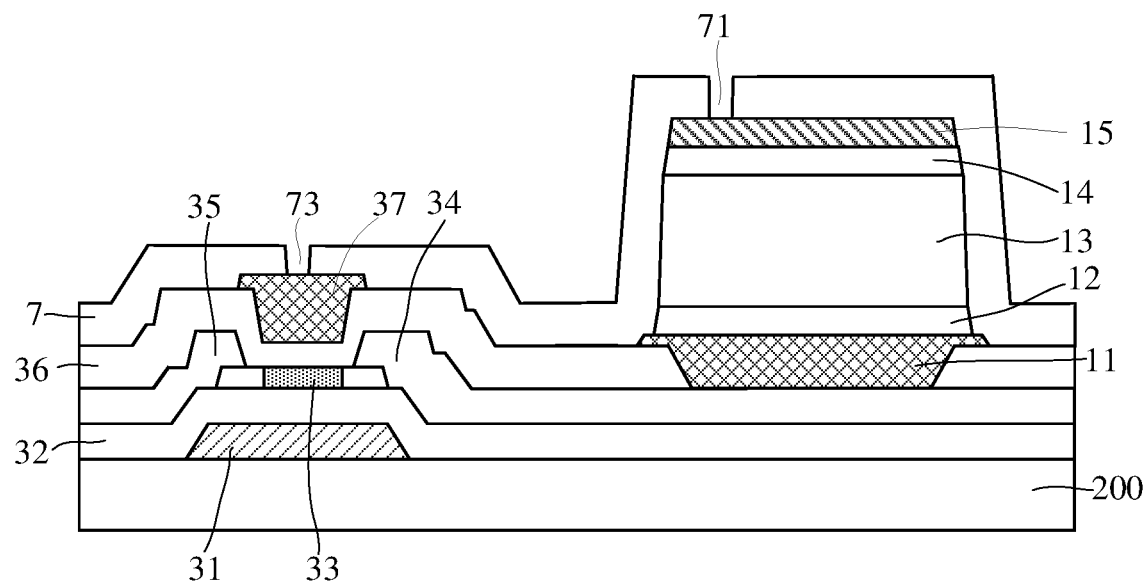

In step S57, as shown in FIG. 15, a second via hole 71 and a third via hole 73 are formed in the overcoating layer 7 so that the second via hole 71 exposes a part of the second electrode layer 15 and the third via hole 73 exposes a part of the second gate electrode 37.

Figure 16:
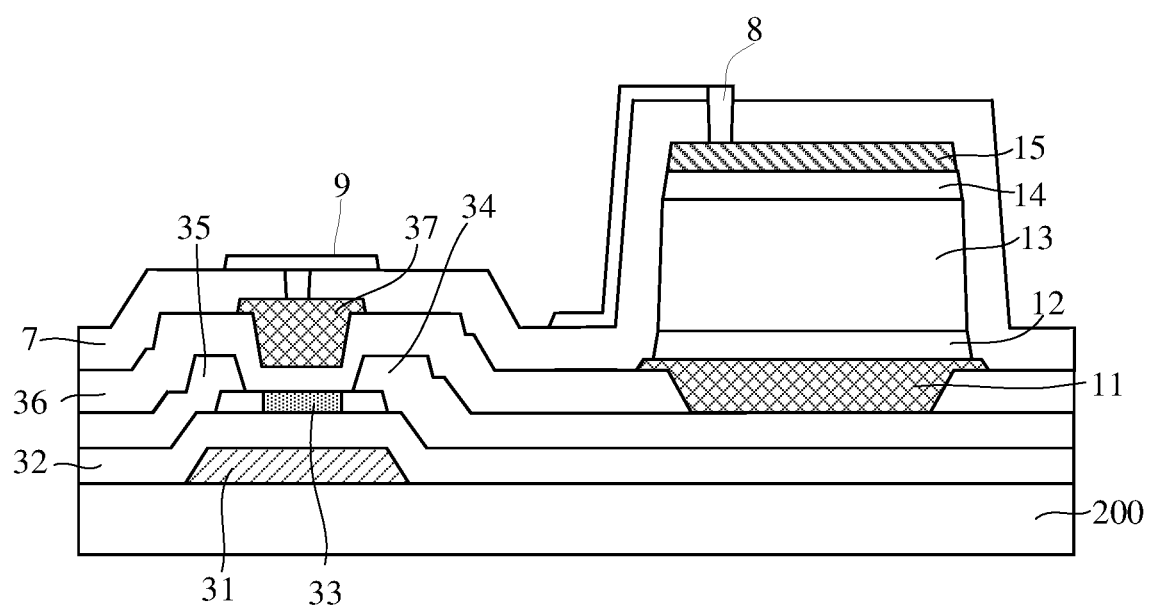

In step S58, as shown in FIG. 16, a first electrode lead 8 and a second electrode lead 9 are formed on the substrate 200.

For example, a deposition process such as sputtering may be used to deposit a metal material layer on a surface of the overcoating layer 7 distal to the substrate 200, in the second via hole 71 and in the third via hole 73. The metal material layer is made of one selected from metals such as Mo, Al, Cu and their alloys. Then, the metal material layer is patterned through a patterning process to form the first electrode lead 8 and the second electrode lead 9, so that at least a part of the first electrode lead 8 is filled into the second via hole 71 and at least a part of the second electrode lead 9 is filled into the third via hole 73.

Figure 17:
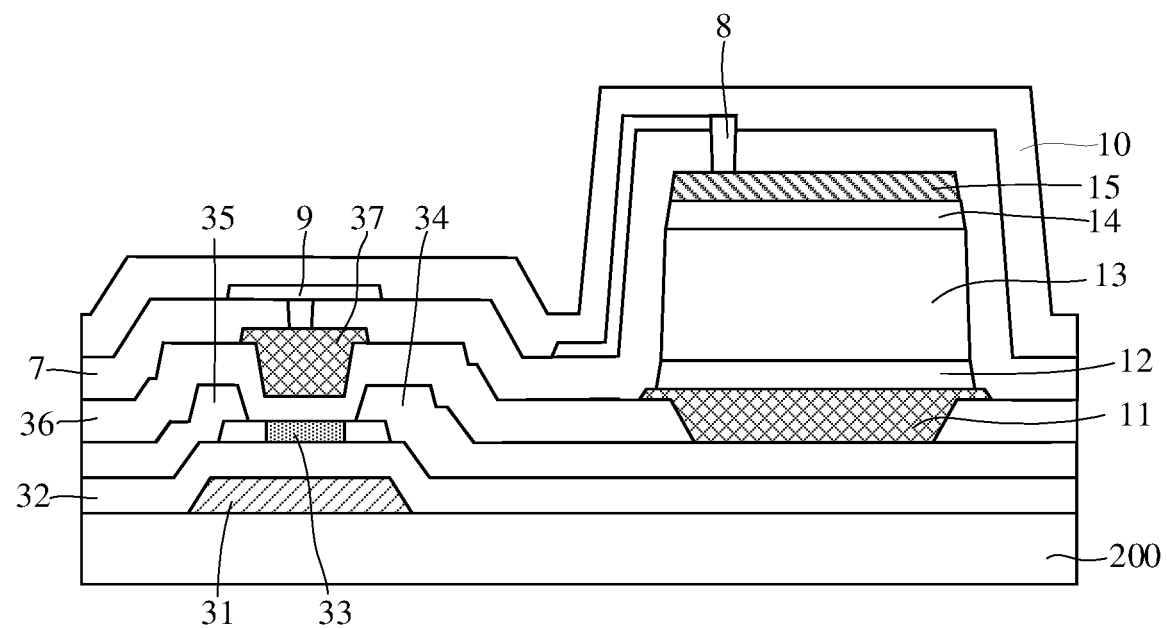

In step S59, as shown in FIG. 17, a passivation layer 10 is formed on a side of the first electrode lead 8 and the second electrode lead 9 distal to the substrate 200, so that the passivation layer 10 covers both the first electrode lead 8 and the second electrode lead 9. The passivation layer 10 also covers both the photosensitive element 1 and the thin film transistor 3.

It should be noted that, according to some embodiments of the present disclosure, some steps in the above method may be performed individually or in combination, and may be performed in parallel or sequentially, and are not limited to the specific operation sequence shown in FIG. 6.

Although some embodiments according to the general technical concept of the present disclosure have been illustrated and described, those skilled in the art will understand that these embodiments may be changed without departing from the principle and spirit of the general technical concept of the present disclosure. Therefore, the scope of the present disclosure shall be defined by appending claims and their equivalents.

What is claimed is:

1. A photosensitive device, the photosensitive device being formed on a substrate, wherein the photosensitive device comprises:
   a photosensitive element comprising:
      a first electrode layer on the substrate;
      a second electrode layer on a side of the first electrode layer distal to the substrate; and
      a photoelectric conversion layer between the first electrode layer and the second electrode layer;
   a thin film transistor electrically connected to the photosensitive element, the thin film transistor comprising:
      a first gate electrode on the substrate;
      an active layer on a side of the first gate electrode distal to the substrate; and
      a second gate electrode on a side of the active layer distal to the substrate; and
   an overcoating layer, wherein the overcoating layer covers both the photosensitive element and the thin film transistor, and the overcoating layer comprises a second via hole and a third via hole, the second via hole exposes a part of the second electrode laver, and the third via hole exposes a part of the second gate electrode; and the photosensitive device comprises a first electrode lead and a second electrode lead, the first electrode lead and the second electrode lead are located in the same layer, a part of the first electrode lead is filled in the second via hole so as to electrically connect with the second electrode layer, and a part of the second electrode lead is filled in the third via hole so as to electrically connect with the second gate electrode, wherein the first electrode layer and the second gate electrode are located in the same layer.

2. The photosensitive device according to claim 1, further comprising an interlayer insulating layer, wherein the interlayer insulating layer comprises a first via hole and a first recess, at least a part of the first electrode layer is filled in the first via hole, and at least a part of the second gate electrode is filled in the first recess.

3. The photosensitive device according to claim 2, wherein the active layer comprises a source region, a drain region and a channel region, and the channel region is located between the source region and the drain region, the interlayer insulating layer comprises a first portion and a second portion, and an orthographic projection of the first portion on the substrate at least partially overlaps with an orthographic projection of the channel region on the substrate, and an orthographic projection of the second portion on the substrate at least partially overlaps with an orthographic projection of the source region or the drain region on the substrate, and a thickness of the first portion is smaller than a thickness of the second portion.

4. The photosensitive device according to claim 3, wherein an orthographic projection of the first recess on the substrate at least partially overlaps with the orthographic projection of the first portion on the substrate.

5. The photosensitive device according to claim 3, wherein the thickness of the first portion is in a range of 100 to 200 nm.

6. The photosensitive device according to claim 3, wherein the orthographic projection of the channel region on the substrate falls within an orthographic projection of each of the first gate electrode and the second gate electrode on the substrate.

7. The photosensitive device according to claim 3, wherein the thin film transistor further comprises a source electrode and a drain electrode, the orthographic projection of the source region on the substrate partially overlaps with an orthographic projection of the source electrode on the substrate, and the orthographic projection of the drain region on the substrate partially overlaps with an orthographic projection of the drain electrode on the substrate; and wherein the first electrode layer contacts the source electrode or the drain electrode, and an orthographic projection of the first electrode layer on the substrate falls within the orthographic projection of the source electrode or the drain electrode on the substrate.

8. The photosensitive device according to claim 1, wherein the active layer comprises an oxide semiconductor layer.

9. The photosensitive device according to claim 8, wherein the photoelectric conversion layer comprises:

a first semiconductor layer located on a side of the first electrode layer distal to the substrate;

an intrinsic semiconductor layer on a side of the first semiconductor layer distal to the substrate; and a second semiconductor layer on a side of the intrinsic semiconductor layer distal to the substrate, wherein, the first semiconductor layer is one selected from a P-type amorphous silicon layer or an N-type amorphous silicon layer, the intrinsic semiconductor layer is an intrinsic amorphous silicon layer, and the second semiconductor layer is the other one selected from the P-type amorphous silicon layer or the N-type amorphous silicon layer.

10. The photosensitive device according to claim 7, wherein the first gate electrode, the second gate electrode, the source electrode, the drain electrode and the first electrode layer each comprise a metal conductive material, and the second electrode layer comprises a transparent conductive material.

11. A detection substrate, comprising:

a substrate; and at least one photosensitive device on the substrate, wherein the photosensitive device is the photosensitive device according to claim 1.

12. An array substrate comprising:

a substrate;

a plurality of sub-pixels on the substrate;

a plurality of display components, the plurality of display components being disposed within the plurality of sub-pixels, respectively; and at least one photosensitive device, the at least one photosensitive device being disposed within at least one sub-pixel, wherein the photosensitive device is the photosensitive device according to claim 1.

13. The array substrate according to claim 12, wherein each of the display components comprises:

an organic light emitting element; and a display driving element, the display driving element being electrically connected to the organic light emitting element and configured to drive the organic light emitting element to emit light, wherein, the display driving element comprises a thin film transistor, and the thin film transistor of the display driving element and the thin film transistor of the photosensitive device are identical in structure.

14. The array substrate according to claim 13, wherein an orthographic projection of the organic light emitting element of the display component on the substrate does not overlap with an orthographic projection of the photosensitive element of the photosensitive device on the substrate.

15. A method for manufacturing a photosensitive device, comprising:

forming a first gate electrode of a thin film transistor on a substrate;

forming an active layer of the thin film transistor on a side of the first gate electrode distal to the substrate;

forming a second gate electrode of the thin film transistor and a first electrode layer of a photosensitive element on a side of the active layer distal to the substrate;

forming a photoelectric conversion layer of the photosensitive element on a side of the first electrode layer distal to the substrate; and forming a second electrode layer of the photosensitive element on a side of the photoelectric conversion layer distal to the substrate, wherein, the step of forming the second gate electrode of the thin film transistor and the first electrode layer of the photosensitive element comprises: forming the second gate electrode of the thin film transistor and the first electrode layer of the photosensitive element by using the same material and through the same patterning process, the method further comprising:

forming an overcoating layer the substrate, wherein the overcoating layer covers both the photosensitive element and the thin film transistor, and the overcoating layer comprises a second via hole and a third via hole, the second via hole exposes a part of the second electrode layer, and the third via hole exposes a part of the second gate electrodes; and the photosensitive device comprises a first electrode lead and a second electrode lead, the first electrode lead and the second electrode lead are located in the same layer, a part of the first electrode lead is filled in the second via hole so as to electrically connect with the second electrode layer, and a part of the second electrode lead is filled in the third via hole so as to electrically connect with the second gate electrode.

16. The method according to claim 15, further comprising:
   forming a source-drain electrode layer of the thin film transistor on a side of the active layer distal to the substrate;
   forming an interlayer insulating material layer on a side of the source-drain electrode layer distal to the substrate; and
   forming a first recess and a first via hole in the interlayer insulating material layer through a patterning process to form an interlayer insulating layer comprising the first recess and the first via hole,
   wherein, the forming the second gate electrode of the thin film transistor and the first electrode layer of the photosensitive element by using the same material and through the same patterning process comprises:
   depositing a metal material layer on a surface of the interlayer insulating layer distal to the substrate, in the first recess and in the first via hole; and
   patterning the metal material layer to form the second gate electrode and the first electrode layer through one patterning process, so that at least a part of the second gate electrode is filled in the first recess and at least a part of the first electrode layer is filled in the first via hole.

17. The method according to claim 16, wherein the forming the first recess and the first via hole in the interlayer insulating material layer through the patterning process comprises:
   coating a surface of the interlayer insulating material layer distal to the substrate with a photoresist layer;
   exposing and developing the photoresist layer by using a gray-tone mask, so that a part of the photoresist layer corresponding to the first via hole to be formed is completely removed, and a part of the photoresist layer corresponding to the first recess to be formed is partially removed;
   performing a first etching process on the interlayer insulating material layer to completely etch the interlayer insulating material layer at a position of the first via hole to be formed so as to form the first via hole;
   performing an ashing process on the remaining photoresist layer to completely expose the interlayer insulating material layer at a position of the first recess to be formed; and
   performing a second etching process on the interlayer insulating material layer to partially etch the interlayer insulating material layer at the position of the first recess to be formed so as to form the first recess, or
   the forming the first recess and the first via hole in the interlayer insulating material layer through the patterning process comprises:
   coating a surface of the interlayer insulating material layer distal to the substrate with a photoresist layer;
   exposing and developing the photoresist layer by using a gray-tone mask, so that a part of the photoresist layer corresponding to the first via hole to be formed is completely removed, and a part of the photoresist layer corresponding to the first recess to be formed is partially removed;
   performing a first etching process on the interlayer insulating material layer to partially etch the interlayer insulating material layer at a position of the first via hole to be formed;
   performing an ashing process on the remaining photoresist layer to completely expose the interlayer insulating material layer at a position of the first recess to be formed; and
   performing a second etching process on the interlayer insulating material layer to completely etch the remaining interlayer insulating material layer at the position of the first via hole to be formed and partially etch the interlayer insulating material layer at the position of the first recess to be formed, so as to form the first via hole and the first recess.

* * * * *